United States Patent [19]
van Ettinger et al.

[11] Patent Number: 5,594,329
[45] Date of Patent: Jan. 14, 1997

[54] METHOD AND APPARATUS FOR OBTAINING VOLTAGE-ISOLATED MEASUREMENT CHANNELS WITH AN ISOLATION TRANSFORMER AND MULTIPLIER

[75] Inventors: Rudolf G. van Ettinger, Vriezenveen; Martinus P. Eikendal, Almelo, both of Netherlands

[73] Assignee: Fluke Corporation, Everett, Wash.

[21] Appl. No.: 526,650

[22] Filed: Sep. 11, 1995

[51] Int. Cl.⁶ .................................................. G01R 19/00
[52] U.S. Cl. ........................................ 324/96; 324/118
[58] Field of Search .................................. 324/142, 123, 324/141, 96, 118, 140; 307/350

[56] References Cited

U.S. PATENT DOCUMENTS

| | | | |
|---|---|---|---|
| 5,017,860 | 5/1991 | Germer et al. | 324/142 |
| 5,034,681 | 6/1991 | Reeves | 324/118 |
| 5,164,660 | 11/1992 | Carl, Jr. | 324/132 |
| 5,198,751 | 3/1993 | Nakamura | 324/141 |
| 5,229,713 | 7/1993 | Bullock et al. | 324/142 |
| 5,311,117 | 5/1994 | Komatsu | 324/142 |

Primary Examiner—Kenneth A. Wieder
Assistant Examiner—Barry C. Bowser
Attorney, Agent, or Firm—Douglas J. Barker

[57] ABSTRACT

A method and apparatus for obtaining a voltage-isolated measurement channel in a measurement instrument is provided. An input signal is multiplied with a clock signal to obtain a modulated input signal that is coupled to an input winding of a balanced transformer. The modulated input signal is electromagnetically coupled from the input winding to an output winding. At the same time, the input winding and the output winding are voltage-isolated, meaning that the portion of the measurement channel coupled to the input winding is "floated" with the input signal whereas the remaining portion of the measurement channel is referenced to instrument ground. A sampling circuit coupled to the output winding samples the modulated input signal in the manner of a synchronous detector to extract the original input signal voltage which is provided to an analog to digital converter which generates the digital measurement values. Each measurement channel is voltage-isolated from the instrument and from all other measurement channels in the instrument.

10 Claims, 3 Drawing Sheets

5,594,329

METHOD AND APPARATUS FOR OBTAINING VOLTAGE-ISOLATED MEASUREMENT CHANNELS WITH AN ISOLATION TRANSFORMER AND MULTIPLIER

BACKGROUND OF THE INVENTION

This invention relates generally to electronic measurement instruments having multiple measurement channels and in particular to a method of obtaining voltage isolation between each measurement channel of an electronic measuring instrument.

Test and measurement equipment such as voltmeters and oscilloscopes measure signals in a wide variety of applications. Many of these applications require measuring multiple signals at the same time using multiple measurement channels. Often, these multiple signals do not share a common ground and may be at substantially different reference levels, thus requiring voltage-isolation between measurement channels coupled to the multiple signals. For example, a measurement application that requires measuring an output voltage of a power supply while simultaneously measuring the power line input must be done with two measurement channels that are voltage-isolated from each other.

However, many measuring instruments have multiple measurement channels that share a common ground at the input terminals, making such commonly desired measurements as the previously power supply example very difficult. The primary problem with measurement channels that are not voltage-isolated is in getting valid measurements. Interference between the multiple signals may result from the differential currents that flow through the common ground because of the different reference levels of the signals. It is also possible that the device being tested can be damaged through differential currents that can flow between the circuit nodes being tested. At high voltages, the common ground may "float" up to hazardous voltage levels to become a safety hazard to the operator who comes in contact with the common ground connection now unexpectedly at an unsafe voltage potential.

A solution to the common Found problem when no voltage-isolated measurement channels are available was to provide two measurement channels that can measure a signal differentially such that the voltage difference is not measured with respect to ground. Such differential mode measurements were difficult both to set up and to obtain signal measurements of acceptable accuracy. Furthermore, two measurement channels must be used to get one voltage measurement. Thus, a total of four input channels are required to obtain two simultaneous measurements of signals with different reference levels, making this solution relatively expensive and with only partially successful measurement results.

Voltage-isolated measurement channels that do not share a common ground connection have a number of advantages. First, ensuring an accurate measurement requires that signals between measurement channels not be contaminated by differential currents flowing through the common ground connection between the measurement channels. Furthermore, operator safety is a concern where a common ground connection between input channels that are not isolated may expose the instrument operator to a hazardous voltage source. Voltage-isolation requires coupling each of the input signals through a voltage isolation barrier which serves to pass the input signal while providing isolation between each of the measurement channels of the reference voltage level of each of the input signals. Achieving voltage isolation between each of the measurement channels within the measurement instrument thereby prevents unexpected connections to hazardous voltage levels via the common ground of the measurement instrument. Voltage-isolated measurement channels simplify the task of setting up a measurement because the user can simply couple each measurement channel to each signal, without regard for the reference voltage levels of each of the signals.

Modern designs of measurement instruments have incorporated digital circuitry to process the input measurements, typically convening the analog input signals into digital measurement values using analog to digital converters (ADC's) and saving the digital measurement values in digital memory for further processing and display. Such instruments include, among others, digital multimeters (DMM's) and digital storage oscilloscopes (DSO's). Converting the input signals to digital measurement values, a process called digitizing, has provided an opportunity to obtain voltage isolation between measurement channels by using ADC's in the voltage-isolated portion of the measurement channel and sending the digital measurement values across a voltage isolation barrier. Voltage isolation barriers for digital signals are commercially-available electronic components commonly referred to as opto-isolators or opto-couplers. A digital signal is coupled across the voltage isolation barrier within the opto-isolator, typically an air gap, using a light emitting diode (LED) which controls a bipolar transistor on the other side of the barrier. However, opto-isolators that provide sufficient data transmission speed tend to be costly and an opto-isolator would be needed for each digital data line. Therefore, it would be desirable to provide a method of providing voltage isolation between measurement channels using a method for coupling an analog input signal across a voltage isolation barrier.

SUMMARY OF THE INVENTION

In accordance with the present invention, a method of coupling an analog input signal across a voltage isolation barrier to obtain voltage isolation between measurement channels is provided. For each measurement channel, an analog input signal is coupled to a multiplier circuit where it is multiplied with a clock signal which toggles between two amplitudes. In this way, the input signal is amplitude modulated with the clock signal. The resulting modulated input signal is coupled to a balanced transformer which operates as a voltage isolation barrier. Voltage-isolated means that the portion of the measurement channel corresponding to the input signal, multiplier, and the input winding of the transformer is "floating", and therefore not referenced or coupled to the measurement instrument ground, or to the ground connection of any other measurement channel in the measurement instrument.

The process of modulating the input signal is necessary in order to couple the signal to the balanced transformer which requires an alternating current signal to operate properly. The modulated input signal is coupled across the balanced transformer essentially unchanged, with the modulated input signal now present at the transformer output. The modulated input signal is coupled to a track and hold circuit which captures an instantaneous voltage level of the modulated input signal according to the same clock signal. In this way, the track and hold circuit operates as a synchronous demodulator by capturing the instantaneous level of the input signal responsive to the same clock signal used to modulate the input signal, thereby removing the effects of the modulation. The track and hold circuit provides the captured voltage levels of the input signal to an analog to digital converter (ADC) which converts them to digital measurement values for further processing by the measurement instrument.

Each measurement channel has its own multiplier, balanced transformer, and track-and-hold circuit to accomplish the voltage isolation function. The same clock signal may be used for any number of measurement channels.

One object of the present invention is to provide a measuring instrument with multiple voltage-isolated measurement channels.

Another object of the present invention is to provide a measurement instrument with voltage-isolated measurement channels by coupling each analog input signal across a voltage isolation barrier.

An additional object of the present invention is to provide a method of coupling an analog input signal across a voltage isolation barrier using synchronous amplitude modulation and demodulation.

Other features, attainments, and advantages will become apparent to those skilled in the art upon a reading of the following description when taken in conjunction with the accompanying drawings.

DETAILED DESCRIPTION OF THE INVENTION

Figure 1:
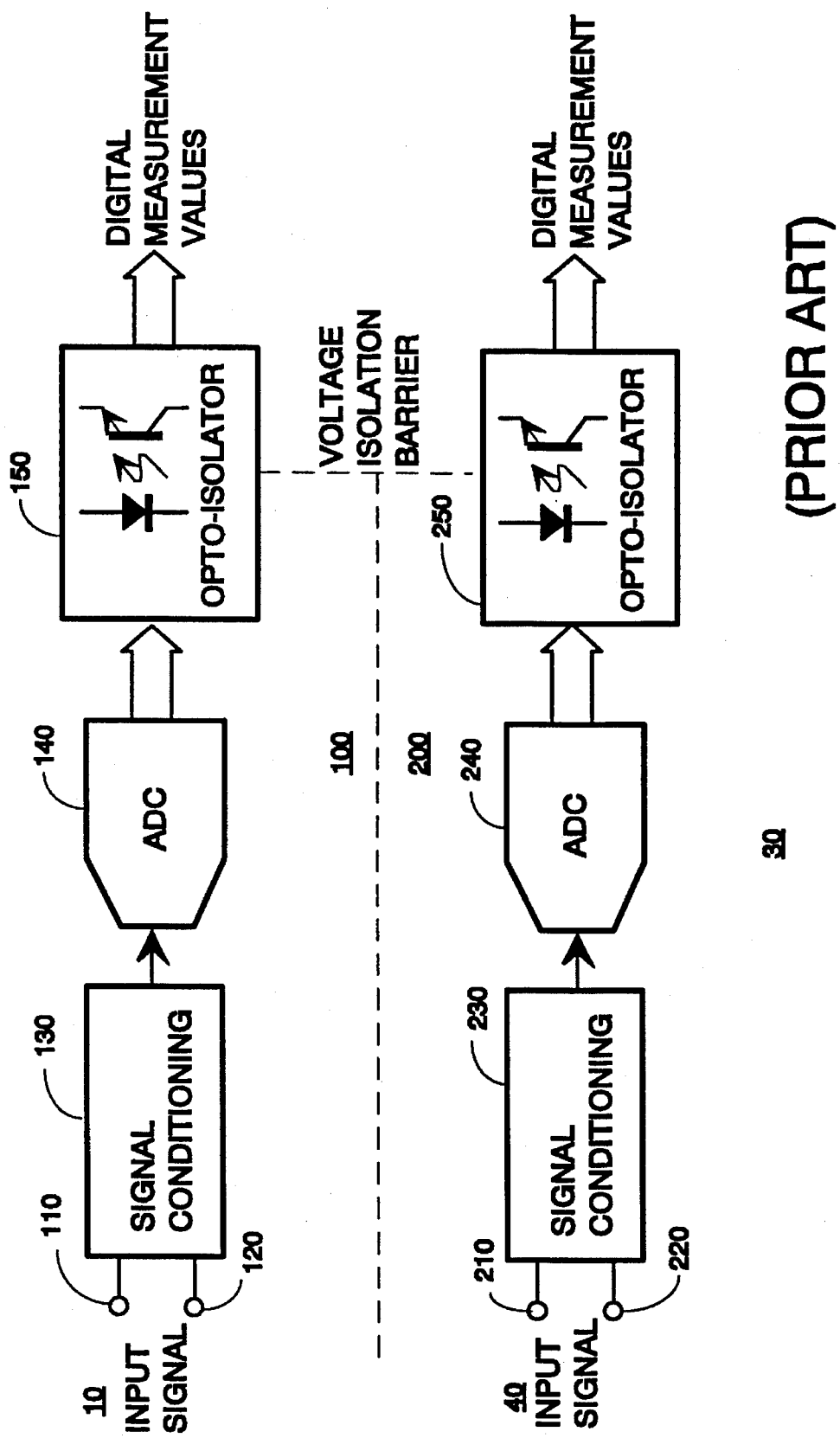
FIG. 1 is a simplified block diagram of two voltage-isolated measurement channels according to the prior art.

FIG. 1 is a simplified block diagram of a two voltage-isolated measurement channels according to the prior art. A measurement channel 100 is shown on the upper half of the diagram. A measurement channel 200 is shown on the lower haft of the diagram. Both measurement channels 100 and 200 are part of a measurement instrument 30. An input signal 10 is coupled across a pair of input terminals 110 and 120. The input terminals 110 and 120 are further coupled to a signal conditioning circuit 130 which may comprise attenuators, amplifiers, switches, filters, or other commonly known circuit elements which operate on the input signal 10 but leaving its essential characteristics for measurement unaltered. An ADC 140 is coupled to the signal conditioning circuit 130 to receive the input signal for conversion to digital measurement values in a process called digitizing. An input of an opto-isolator 150 is coupled to the ADC 140 to receive the digital measurement values. Opto-isolators are commercially available devices and are well known in the art to provide voltage isolation for digital signals. The digital measurement values may be in the form of serial data, such that only one opto-isolator is required, or in the form of parallel data, such that an opto-isolator is required for each data line. The opto-isolator 150 therefore may be taken to represent either a single opto-isolator or a collective group of individual opto-isolators operating in parallel to implement the voltage isolation function by coupling the digital measurement values across a voltage isolation barrier. The digital measurement values are available at the output of the opto-isolator 150 for further processing.

The measurement channel 200, shown on the bottom half of the diagram, is coupled to an input signal 40 at a pair of input terminals 210 and 220. The input terminals 210 and 220 are coupled to a signal conditioning circuit 230 which is further coupled to an ADC 240 in the similar manner to the measurement channel 100. The digital measurement values from the ADC 240 are coupled across an opto-isolator 250 which operates as a voltage isolation barrier which isolates the measurement channel 200 from the measurement channel 100 and the rest of the measurement instrument 30.

Figure 2:
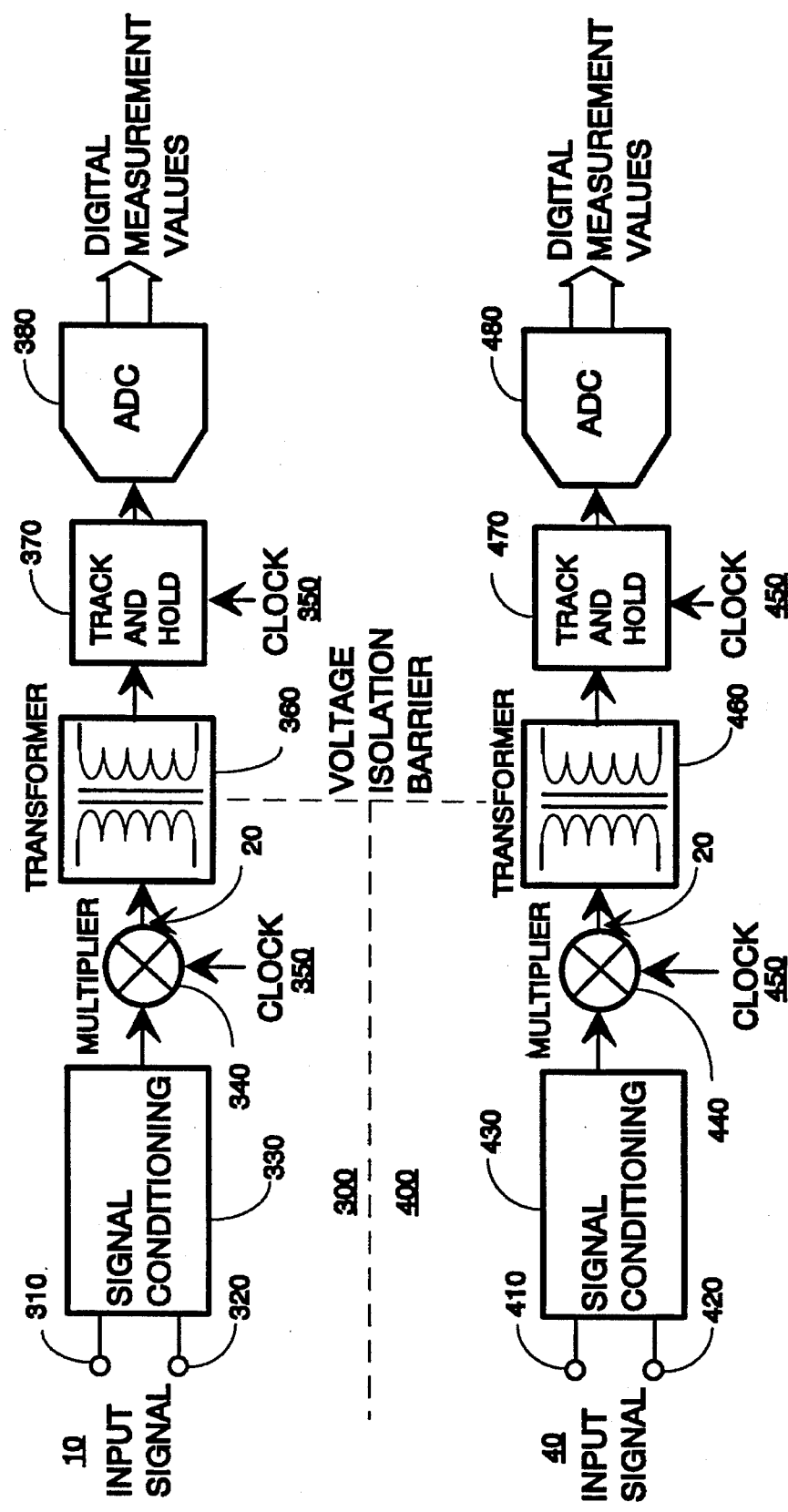
FIG. 2 is a simplified block diagram of two voltage-isolated measurement channels according to the present invention.

FIG. 2 is a simplified block diagram of two voltage-isolated measurement channels according to the present invention. The input signal 10 is coupled to a pair of input terminals 310 and 320. The input terminals 310 and 320 are further coupled to a signal conditioning circuit 330 which receives the input signal 10. The signal conditioning circuit 330 may comprise attenuators, amplifiers, switches, filters, or other commonly known circuit elements which operate to convert the input signal to a desired form but with its essential characteristics for measurement unaltered. A multiplier 340 has an input coupled to receive the input signal from the signal conditioning circuit 330. The multiplier 340 has a second input coupled to a clock signal 350. Clock signal 350 is essentially a digital signal and has two discrete amplitude levels, high and low. The multiplier 340 is an analog multiplier in the present invention which switches on and off responsive to the high and low levels of the clock signal 350. The high level is a predetermined value compatible with the multiplier 340 to yield a desired level of the modulated input signal 20 and the low level is equal in magnitude to the high level but opposite in polarity such that that direct current (d.c.) component of the clock signal 350 is substantially zero. Other types of multipliers may have other types of voltage level requirements. The multiplier 340 serves to multiply the clock signal 350 by the input signal 10 to obtain a modulated input signal 20 in the manner of amplitude modulation. The modulated input signal 20 thus resembles the clock signal 350 but with the amplitude modulated by the level of the input signal 10. In the preferred embodiment, the multiplier 340 is comprised of a linear four quadrant multiplier which are known in the art. In this way, the modulated input signal is now suitable for coupling through a transformer which must have an alternating current signal in order to operate properly.

A transformer 360 is coupled to the output of the multiplier 340 to receive the modulated input signal 20 which is coupled across a balanced input winding. The transformer 360 must be capable of transferring the modulated input signal from an input winding to an output winding via electromagnetic coupling with a minimum amount of distortion in amplitude and without sensitivity to the common mode level of the signal. An important design consideration of the transformer 360 is that the modulated input signal 20 be applied differentially so that the windings have a balanced capacitance, which is important in achieving a high common mode rejection ratio. The clock signal 350 has a frequency that is sufficiently high to allow the use of radio frequency design techniques, which provide a method of achieving balanced windings in a way well known in the art. The use of a transformer 360 designed to operate at radio frequencies allows the use of transformer types that require less physical space. Furthermore, the input and output windings must be spaced physically far enough apart to provide an acceptable amount of voltage isolation between the input and output windings so as to function as a voltage isolation barrier. To be voltage-isolated means that the portion of the measurement channel 300 corresponding to the input signal 10, signal conditioning circuit 330, multiplier 340, and the input winding of the transformer 360 is "floating", not referenced to the instrument 30 ground, or the ground of any other measurement channel of the instrument 30.

In the preferred embodiment, the transformer 360 is implemented as a toroidal transformer with tri-filar windings to achieve the desired performance. Important transformer performance considerations include the linearity of the transfer of the modulated input signal 20 between the input and the output winding, as well as limitations on the maximum signal level related to transformer core saturation. Other winding and core configurations may be selected according to the design requirements.

The modulated input signal 20 is electromagnetically coupled from the input winding to the output winding and thus appears at the output winding of the transformer 360 substantially unchanged but now voltage-isolated. A track and hold circuit (T/H) 370 is coupled to the output winding of the transformer 360 to receive the modulated input signal 20. The clock signal 350 is coupled to a clock input of the T/H 370 such that the T/H 370 captures an instantaneous voltage level of the modulated input signal 20 synchronized to the rate at which the input signal 10 is modulated and retains it as a discrete voltage level. The T/H 370 is a sampling circuit that functions as a synchronous detector by extracting the voltage level corresponding to the input signal 10 while rejecting the clock signal 350 switching components. Other sampling circuits, such as the commonly available sample and hold circuit, may be substituted for the T/H 370. The entire process of multiplying the input signal 10 with the clock signal 350 and sampling the resulting modulated input signal 20 according to the same clock signal 350 is commonly known as synchronous amplitude modulation and demodulation.

The discrete voltage levels captured by the T/H 370 are coupled to an ADC 380 which converts each of the discrete levels to digital measurement values in a process commonly referred as digitizing. The digital measurement values are then provided to the remaining portions of the measurement instrument 30 for storage and further processing.

A second measurement channel 400 receives the input signal 40 across a pair of input terminals 410 and 420 which are further coupled to a signal conditioning circuit 430. The signal conditioning circuit 430 may comprise attenuators, amplifiers, switches, filters, and other commonly known circuit elements which operate to convert the input signal 40 to a desired form. A multiplier 440 has an input coupled to receive the input signal from the signal conditioning circuit 430. The multiplier 440 has a second input coupled to a clock signal 450. A transformer 460 is coupled to receive the modulated input signal which is further coupled to a T/H 470. The T/H 470 is further coupled to the ADC 480 which produces digital measurement values. A clock signal 450 is coupled to the multiplier 440 and to the T/H 470 and may be derived from the clock signal 450 or operate independently. The second measurement channel 400 operates in a manner substantially the same as the measurement channel 300, with the transformer 460 forming a voltage isolation barrier from the measurement channel 300 and from the measuring instrument.

Isolating a measurement channel requires isolating not only the input signals 10 and 40 but also all of the power, clock, and control signals provided by the measurement instrument 30 to the measurement channels 100 and 200 using additional voltage isolation methods for power line signals and digital signals that are known in the an. These additional voltage isolation methods are not illustrated. For example, the clock signal 350, which is used both for the multiplier 340 and the T/H 370 in order to achieve the synchronous modulator and demodulation, must be coupled across a voltage isolation barrier between the multiplier 350 and the T/H 370. Because the clock signal 350 is digital, a conventional opto-isolator or a transformer may be used to achieve voltage isolation. As a further example of voltage isolation techniques, the device power provided for the signal conditioning circuit 330 and multiplier 340 must be isolated, typically using a power transformer with voltage-isolated primary and secondary windings. Finally, any control signals between the instrument 30 and measurement channels 100 and 200 must be voltage-isolated, again using opto-isolators. These voltage-isolation techniques are known in the art and their choice is not critical to practice the present invention which involves voltage isolation of the input signals 10 and 40.

Figure 3A:
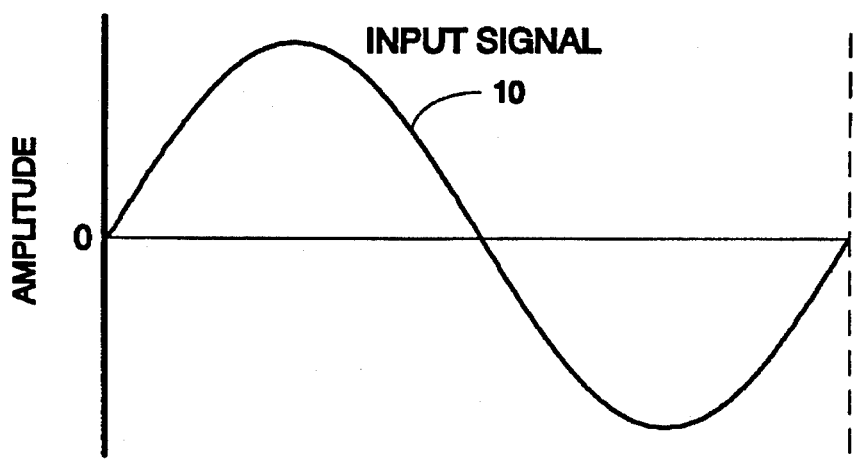
FIGS. 3A–C together comprise a graph illustrating the process of modulating an input signal with a clock signal to obtain a modulated input signal according to the present invention.
Figure 3B:
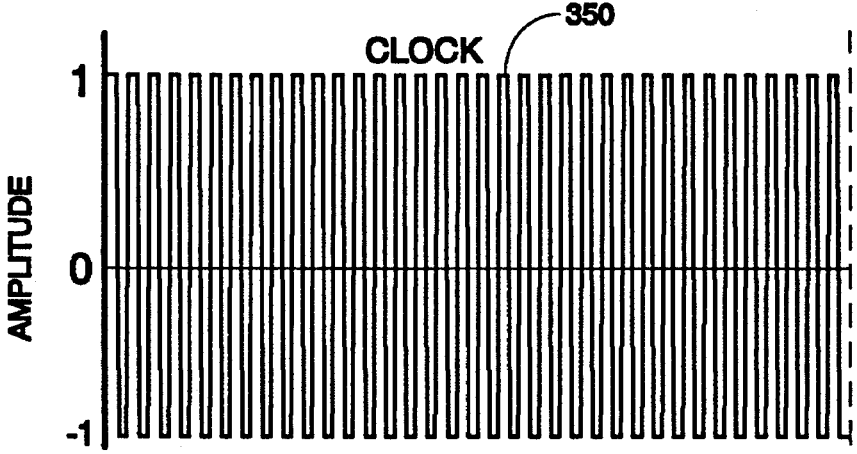
Figure 3C:
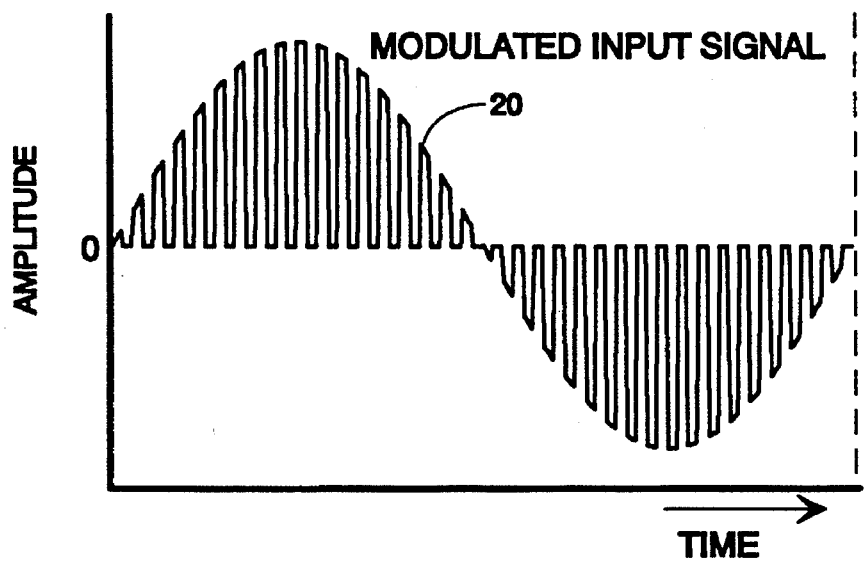

FIG. 3A–C together comprise a graph (not to scale) illustrating the process of modulating the input signal 10 with the clock signal 350 to obtain the modulated input signal 20 according to the present invention. FIG. 3A is a graph of the input signal 10 present at the input of the multiplier 340. Input signal 10 is shown for illustration purposes in the form of a sine wave but the choice of waveshape is arbitrary. FIG. 3B is a graph illustrating the clock signal 350 with an amplitude which varies between a predetermined low level of −1 volts and a predetermined high value of +1 volts, the magnitudes of which correspond to a value that yields the modulated input signal 20 with a desired peak to peak amplitude. The high and low levels are the substantially the same magnitude but of opposite polarity to keep the average d.c. value of the clock signal 350 to be zero, a requirement necessary to avoid introducing a d.c. value to the modulated input signal which would be imposed on the transformer 360. The high level may be varied up or down to adjust the amplitude of the modulated output signal as needed. FIG. 3C illustrates the modulated output signal which is the input signal of FIG. 3A multiplied by the clock signal 350 of FIG. 3B. The modulated input signal 20 is coupled across the voltage isolation barrier of the transformer 360 to the T/H 370. The T/H 370, synchronized by the clock 350, captures a discrete voltage level corresponding to each of the peak values of the modulated input signal 20 to recover a sampled representation of the input signal 10. Each voltage sample is converted to a digital measurement value by the ADC 380 and provided to the measurement instrument 30.

It will be obvious to those having ordinary skill in the art that many changes may be made in the details of the above described preferred embodiments of the invention without departing from the spirit of the invention in its broader aspects. For example, different types of transformers may be used, depending on the level of performance and frequency range required for the application. Furthermore, the present invention may be practiced in measurement instruments 30 with as few as one measurement channel 100 or as many measurement channels as needed. Therefore, the scope of the present invention should be determined by the following claims.

What I claim as my invention is:

1. A voltage-isolated measurement channel, comprising:

(a) a multiplier adapted for receiving an input signal and coupled to a clock signal, said multiplier multiplying said input signal by said clock signal to produce a modulated input signal at a multiplier output;

(b) a transformer coupled to said multiplier output to receive said modulated input signal at an input winding, said transformer reproducing said modulated input signal in an output winding wherein said input winding is voltage-isolated from said output winding by a voltage isolation barrier;

(c) a sampling circuit coupled to said output winding to receive said modulated input signal and further coupled to said clock signal to capture voltage samples of said modulated input signal responsive to said clock signal; and (d) an analog to digital converter coupled to said sampling circuit to receive said voltage samples and produce digital measurement values from said voltage samples.

2. A voltage-isolated measurement channel according to claim 1 wherein said sampling circuit further comprises a track and hold circuit.

3. A voltage-isolated measurement channel according to claim 1 wherein said sampling circuit further comprises a sample and hold circuit.

4. A measurement instrument having a plurality of voltage-isolated measurement channels, each of said voltage-isolated measurement channels comprising:

(a) a multiplier adapted for receiving an input signal and coupled to a clock signal, said multiplier multiplying said input signal and said clock signal to produce a modulated input signal at a multiplier output;

(b) a transformer coupled to said multiplier output to receive said modulated input signal at an input winding, said transformer reproducing said modulated input signal in an output winding wherein said input winding is voltage-isolated from said output winding by a voltage isolation barrier;

(c) a sampling circuit coupled to said output winding to receive said modulated input signal and further coupled to said clock signal to capture voltage samples of said modulated input signal responsive to said clock signal; and (d) an analog to digital converter coupled to said sampling circuit to produce digital measurement values from said voltage samples and further coupled to said measurement instrument to provide said digital measurement values wherein each of said measurement channels is voltage-isolated from every other of said measurement channels and from said measurement instrument.

5. A voltage-isolated measurement channel according to claim 4, said sampling circuit further comprising a track and hold circuit.

6. A voltage-isolated measurement channel according to claim 4, said sampling circuit further comprising a sample and hold circuit.

7. In a measurement channel for measuring an input signal, a method for obtaining voltage isolation of said input signal, comprising:

(a) multiplying said input signal by a clock signal to obtain a modulated input signal;

(b) electromagnetically coupling said modulated input signal from an input winding to an output winding of a transformer wherein said input and output windings are voltage-isolated by a voltage isolation barrier;

(c) sampling said modulated input signal received from said output winding wherein said sampling is synchronized to said clock signal to produce voltage samples according to said input signal; and (d) digitizing said voltage samples to produce digital measurement values of said input signal.

8. A method for obtaining voltage isolation according to claim 7 further comprising sampling said modulated input signal using a track and hold circuit.

9. A method for obtaining voltage isolation according to claim 7 further comprising sampling said modulated input signal using a sample and hold circuit.

10. A method for obtaining voltage isolation according to claim 7 further comprising digitizing said voltage samples using an analog to digital converter.

* * * * *